(12) United States Patent
Hayashi

(10) Patent No.: US 8,159,033 B2
(45) Date of Patent: Apr. 17, 2012

(54) ESD PROTECTION DEVICE AND MANUFACTURING METHOD THEREOF

(75) Inventor: Hirokazu Hayashi, Tokyo (JP)

(73) Assignee: Lapis Semiconductor Co., Ltd. (JP)

( * ) Notice: Subject to any disclaimer, the term of this patent is extended or adjusted under 35 U.S.C. 154(b) by 0 days.

(21) Appl. No.: 12/379,933

(22) Filed: Mar. 4, 2009

(65) Prior Publication Data

US 2009/0242993 A1    Oct. 1, 2009

(30) Foreign Application Priority Data

Mar. 27, 2008    (JP) .................................. 2008-082342

(51) Int. Cl.
*H01L 23/62* (2006.01)
(52) U.S. Cl. ........ 257/355; 257/328; 257/373; 257/408; 257/E29.012
(58) Field of Classification Search .................. 257/328, 257/355, 356, 360, 546, 373
See application file for complete search history.

(56) References Cited

U.S. PATENT DOCUMENTS

2002/0084490 A1*    7/2002    Ker et al. ...................... 257/355
2006/0284258 A1*    12/2006    Huang et al. .................. 257/356

FOREIGN PATENT DOCUMENTS

JP    05-235283    9/1993
JP    3422313    6/2003

* cited by examiner

*Primary Examiner* — Minh-Loan T Tran
*Assistant Examiner* — Leslie Pilar Cruz
(74) *Attorney, Agent, or Firm* — Rabin & Berdo, P.C.

(57) ABSTRACT

A junction forming region is formed between a drain region of a MOS structure and a device isolation region which surrounds the MOS structure and is in contact with the drain region, to form a PN junction together with the drain region. As a consequence, it is possible to adjust a breakdown voltage of an ESD protection device which is fabricated in the same process as that for an internal device without varying basic performance of the internal device even at a final stage of an LSI manufacturing process.

14 Claims, 6 Drawing Sheets

ESD PROTECTION DEVICE AND MANUFACTURING METHOD THEREOF

CROSS-REFERENCE TO RELATED APPLICATION

This application claims priority under 35 USC 119 from Japanese Patent Application No. 2008-082342, the disclosure of which is incorporated by reference herein.

BACKGROUND OF THE INVENTION

1. Field of the Invention

The present invention relates to an ESD protection device for protecting an internal circuit in a semiconductor integrated circuit device, and a manufacturing method thereof.

2. Description of Related Art

A technique of inserting an ESD (Electrostatic Discharge) protection device between a pad and an internal circuit so as to prevent excessive current from flowing in the internal circuit when an ESD surge is applied from the pad, is generally known. The ESD protection device needs to be designed such that current instantaneously flows in the ESD protection device when a voltage applied to the internal circuit or a current flowing in the internal circuit exceeds a rated value.

A MOSFET, a PN diode, or an SCR (Silicon Controlled Rectifier) have conventionally been used as ESD protection devices. In a MOSFET, a current driving capability can be enhanced by designing a channel region so as to have a larger width. Further, in an SCR, a high ESD protection capability can be acquired due to a small holding voltage and a small ON-resistance in a relatively small area. Therefore, both of the MOSFET and the SCR have been widely utilized in the conventional art. The small holding voltage can reduce power consumption as defined by current multiplied by voltage. Furthermore, the small ON-resistance allows the current to instantaneously flow in the ESD protection device, thereby producing an advantage of an excellent ESD resistance.

One example of an ESD protection device utilizing a MOSFET will be explained in reference to FIG. 6.

On a P-type semiconductor substrate 101, an N-type drain region 102 and an N-type source region 103 are formed. On the drain region 102, a drain electrode 104 is formed whereas on the source region 103, a source electrode 105 is formed. Between the drain region 102 and the source region 103 on the P-type semiconductor substrate 101, a gate electrode 107 is formed via an oxide film 106. On both sides of the gate electrode 107, side walls 108 are formed. An LDD (Light Doped Drain) region 109 is formed at an end of each of the drain region 102 and the source region 103 in a direction of the substrate facing the gate electrode 107. On the other hand, a device isolation region 110 is formed at an end of each of the drain region 102 and the source region 103 on a side opposite to the LDD region 109. Outward of the device isolation region 110 in the direction of the substrate, a P well 111 serving as a P-type conductive region is formed, on which a well electrode 112 is formed.

Breakdown occurs mainly when an impact ionization phenomenon becomes manifest. Therefore, in the ESD protection device 100 shown in FIG. 6, breakdown occurs mostly at the drain region 102 in the vicinity of an end of the gate electrode 107 of the drain 102 under a channel region in the case that a concentration of an impurity doped in the drain region 102 is high.

For the ESD protection device, a structure may be adopted in which the width of a channel region is larger than that of an internal device, or a comb structure, or a device having a combination of a MOSFET and an SCR may be adopted.

Devices using a MOS structure as other ESD protection devices are disclosed in Japanese Patent Application Laid-Open (JP-A) No. 5-235283 and Japanese Patent No. 3422313.

An ESD protection device and an integrated circuit including the same are designed in a process that is performed near a final stage of an LSI manufacturing process. Therefore, it is difficult to change the setting of an impurity profile or the like relating to basic characteristics of transistors which have been already optimized.

In addition, in order to reduce the number of masks and the number of processes, an internal device that forms an internal circuit, and an ESD protection device, are formed in the same process. As a consequence, it is difficult to adjust the breakdown voltage of an ESD protection device having the structure shown in FIG. 6 at the final stage, by which stage the internal device has been completely optimized.

SUMMARY OF THE INVENTION

The present invention has been accomplished in light of the above-described circumference. Therefore, an object of the invention is to provide an ESD protection device which is formed in the same process as that for an internal device, and whose breakdown voltage can be adjusted without varying basic performance of the internal device even at a final stage of an LSI manufacturing process, and a manufacturing method thereof In order to solve the above-described problem, the present invention provides an ESD protection device including a MOS structure formed inside of a semiconductor functional device layer and having a drain region of the MOS structure as a surge absorbing end, the ESD protection device including:

a device isolation region surrounding the MOS structure; and a junction forming region formed between the drain region of the MOS structure and the device isolation region, and being in contact with the drain region, to form a PN junction together with the drain region.

Moreover, the junction forming region may surround at least a part of the drain region.

Additionally, the drain region may include a doped drain region in a concentration lower than that of the drain region at a portion in contact with the junction forming region.

In addition, the impurity concentration of the junction forming region may be higher than that of the channel region in the MOS structure.

Moreover, a breakdown voltage of the junction forming region may be lower than that of the MOS structure.

In order to solve the above-described problems, additionally, the present invention provides a method of manufacturing an ESD protection device including:

preparing a semiconductor substrate;

forming a semiconductor functional device layer including a MOS structure surrounded by a device isolation region on the semiconductor substrate;

forming an adjustment layer as a junction forming region between a drain region of the MOS transistor and the device isolation region and in contact with the drain region, to form a PN junction together with the drain region; and forming an insulating layer on the semiconductor functional device layer after the formation of the adjustment layer.

In addition, in the forming of the adjustment layer, the junction forming region may formed so as to surround at least a part of the drain region.

Moreover, in the forming of the adjustment layer, an impurity concentration of the junction forming region may be adjusted to be higher than that of a channel region in the MOS structure.

According to the invention, the junction forming region is formed between the drain region of the MOS structure and the device isolation region surrounding the MOS structure and in contact with the drain region, to form the PN junction together with the drain region. As a consequence, it is possible to adjust the breakdown voltage of the ESD protection device, which is formed in the same process as that for the internal device, without varying basic performance of the internal device even at the final stage of the LSI manufacturing process.

BRIEF DESCRIPTION OF THE DRAWINGS

Preferred exemplary embodiments of the present invention will be described in detail based on the following figures, wherein.

DETAILED DESCRIPTION OF THE INVENTION

A detailed description will be given below of exemplary embodiments according to the present invention in reference to the attached drawings.

[First Exemplary Embodiment]

First of all, a description will be given in detail of the structure of an ESD protection device 10 in a first exemplary embodiment according to the invention in reference to FIGS. 1A and 1B.

The ESD protection device 10 includes a MOS structure 20 formed inside a semiconductor functional device layer, in which a drain region 12 of the MOS structure 20 serves as a surge absorbing end. The ESD protection device 10 includes a device isolation region 23 surrounding the MOS structure 20 and a junction forming region formed between the drain region 12 of the MOS structure 20 and the device isolation region 23, the junction forming region contacting the drain region 12 to form a PN junction together with the drain region 12. The ESD protection device 10 specifically has the following structure.

Figure 1A:
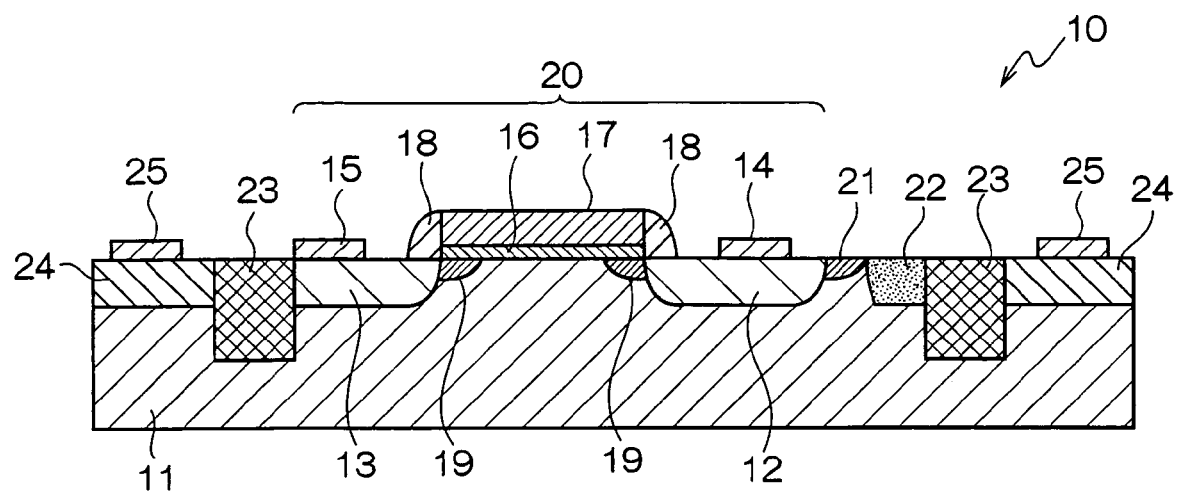
FIG. 1A is a cross-sectional view showing an ESD protection device in an exemplary embodiment according to the invention.

As shown in FIG. 1A, the N-type drain region 12 serving as the surge absorbing end and an N-type source region 13 are formed on a P-type semiconductor substrate 11. On the drain region 12, a drain electrode 14 is formed whereas on the source region 13, a source electrode 15 is formed. A gate electrode 17 is formed via an oxide film 16 on the P-type semiconductor substrate 11 between the drain region 12 and the source region 13. On both sides of the gate electrode 17, side walls 18 are formed. Moreover, N-type LDD regions 19 are formed at ends of the drain region 12 and the source region 13 facing the gate electrode 17 (i.e., in a direction of the substrate). That is the N-type LDD regions 19 are formed on a side of a channel region at portions of the semiconductor substrate 11 facing the oxide film 16. Here, each of the N-type LDD regions has an impurity concentration lower than those of the drain region 12 and the source region 13. The MOS structure 20 is constituted of the N-type drain region 12, the N-type source region 13, the drain electrode 14, the source electrode 15, the oxide film 16, the gate electrode 17, the side walls 18, and the LDD regions 19, described above. Here, the MOS structure is not limited to the above-described example, and may not include a side wall 18 or an LDD region.

At an end of the drain region 12, not facing the gate electrode 17 (i.e., on a side opposite to the channel region), an N-type LDD region 21 serving as a doped drain region having an impurity concentration lower than that of the drain region 12 is formed as a part of the drain region 12. The LDD region 21 is brought into contact with a P-type impurity diffusion region 22 serving as a junction forming region. Therefore, a PN junction is formed by the LDD region 21 and the impurity diffusion region 22. The impurity concentration of the impurity diffusion region 22 is preferably higher than that of the channel region of the MOS structure 20 (i.e., higher than that of the semiconductor substrate 11). With such a concentration profile, breakdown can be made to occur first at the PN junction. When the LDD region 21 is not formed, the drain region 12 may be brought into direct contact with the impurity diffusion region 22, thereby forming the PN junction.

In the meantime, at an end of the impurity diffusion region 22 out of contact with the LDD region 21 and at an end of the source region 13 not having any LDD region 19, the device isolation regions 23 are formed, respectively. Farther outside of the device isolation regions 23 (in the direction of the substrate), P wells 24 serving as P-type conductive regions are formed, on which well electrodes 25 are formed. Here, the P well 24 is higher in concentration than the impurity diffusion region 22. The MOS structure 20, the device isolation regions 23, the P well 24, and the well electrode 25 constitute a semiconductor device functional layer.

Incidentally, although in the ESD protection device 10 shown in FIG. 1A, the N channel type MOS structure 20 is formed on the P-type semiconductor substrate 11, a P channel type MOS structure may be formed on an N-type semiconductor substrate. In such a case, the relationship between the N-type and the P-type is established vice versa in the above entire description.

Figure 1B:
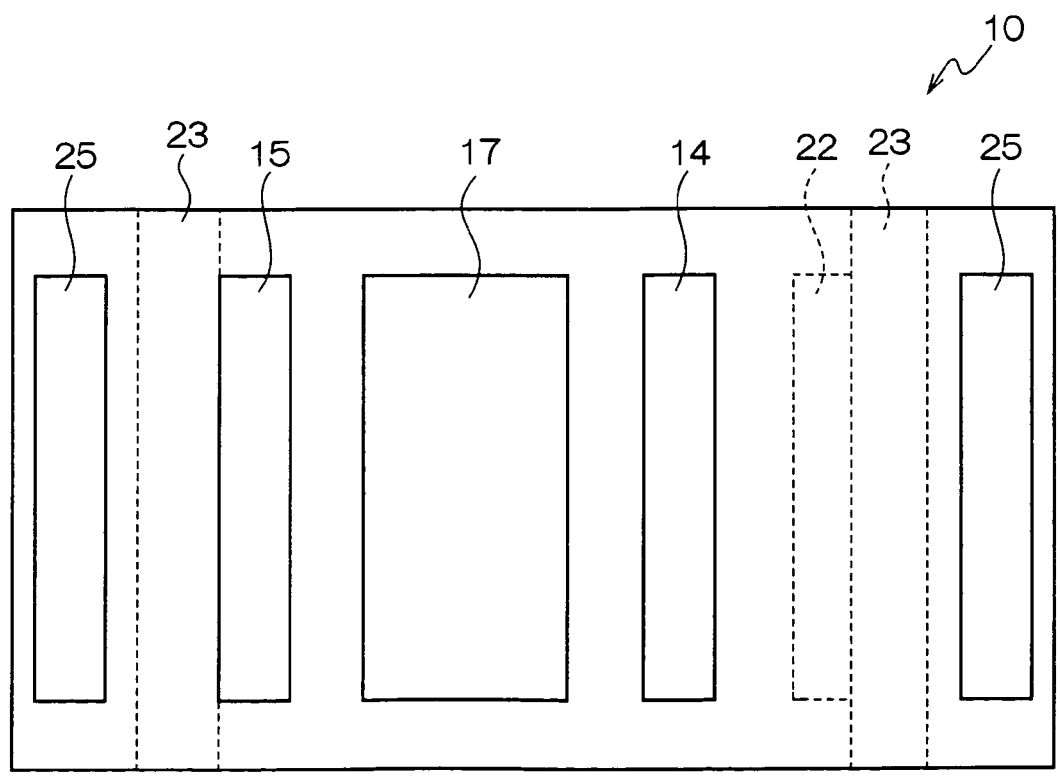
FIG. 1B is a top view showing the ESD protection device in the exemplary embodiment according to the invention.

As shown in FIG. 1B, all of the drain electrode 14, the source electrode 15, and the gate electrode 17 are rectangular. Furthermore, the impurity diffusion region 22 is formed into a rectangular shape and is in parallel to the drain electrode 14.

Next, in reference to FIG. 2, explanation will be made on one example of wiring in the ESD protection device 10 in the exemplary embodiment according to the invention and one example of formation of an ESD protecting circuit by connecting the ESD protection device 10 and an SCR to each other.

Figure 2:
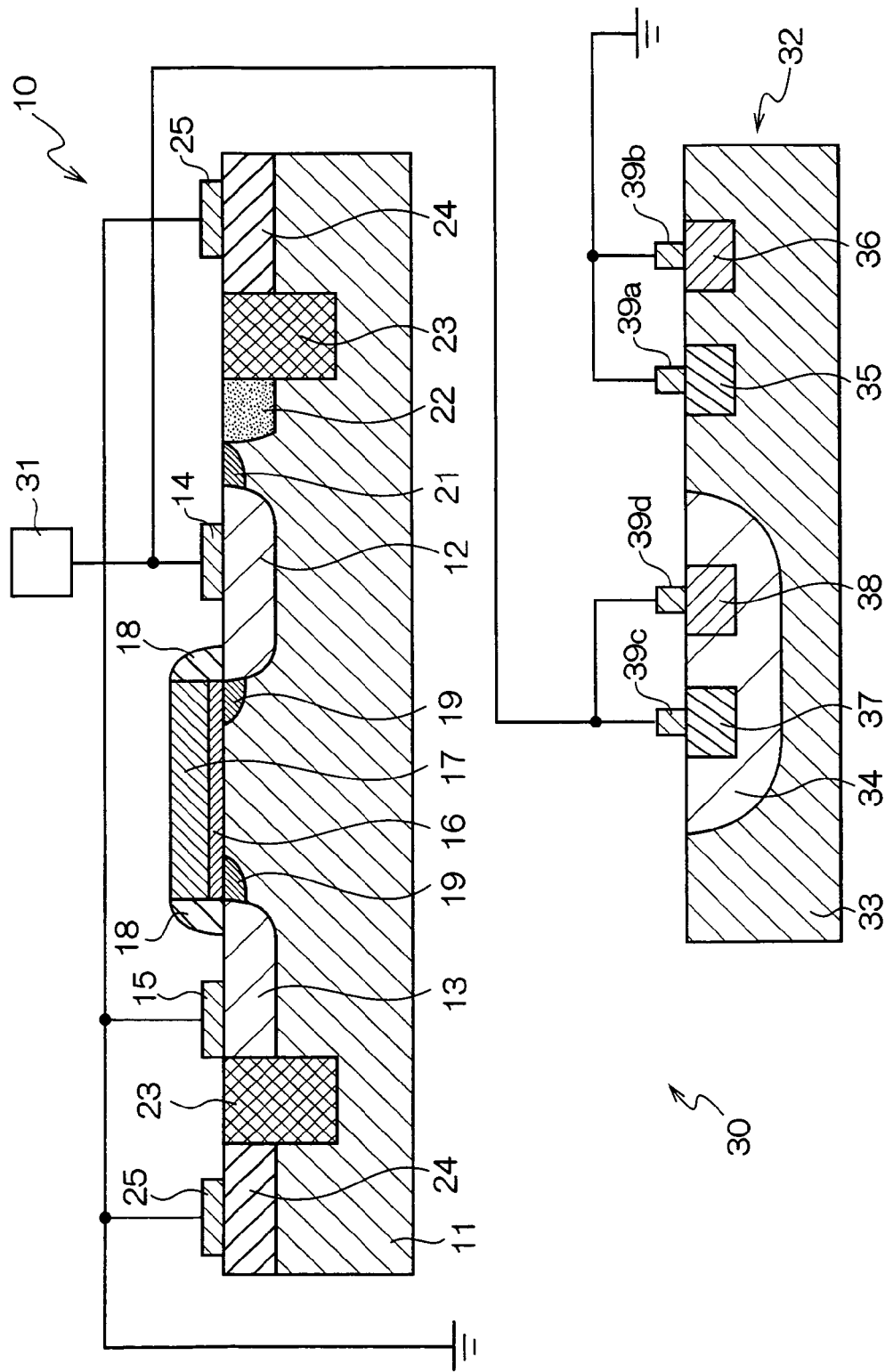
FIG. 2 is a cross-sectional view exemplifying wiring in the ESD protection device in the exemplary embodiment according to the invention.
Figure 3:
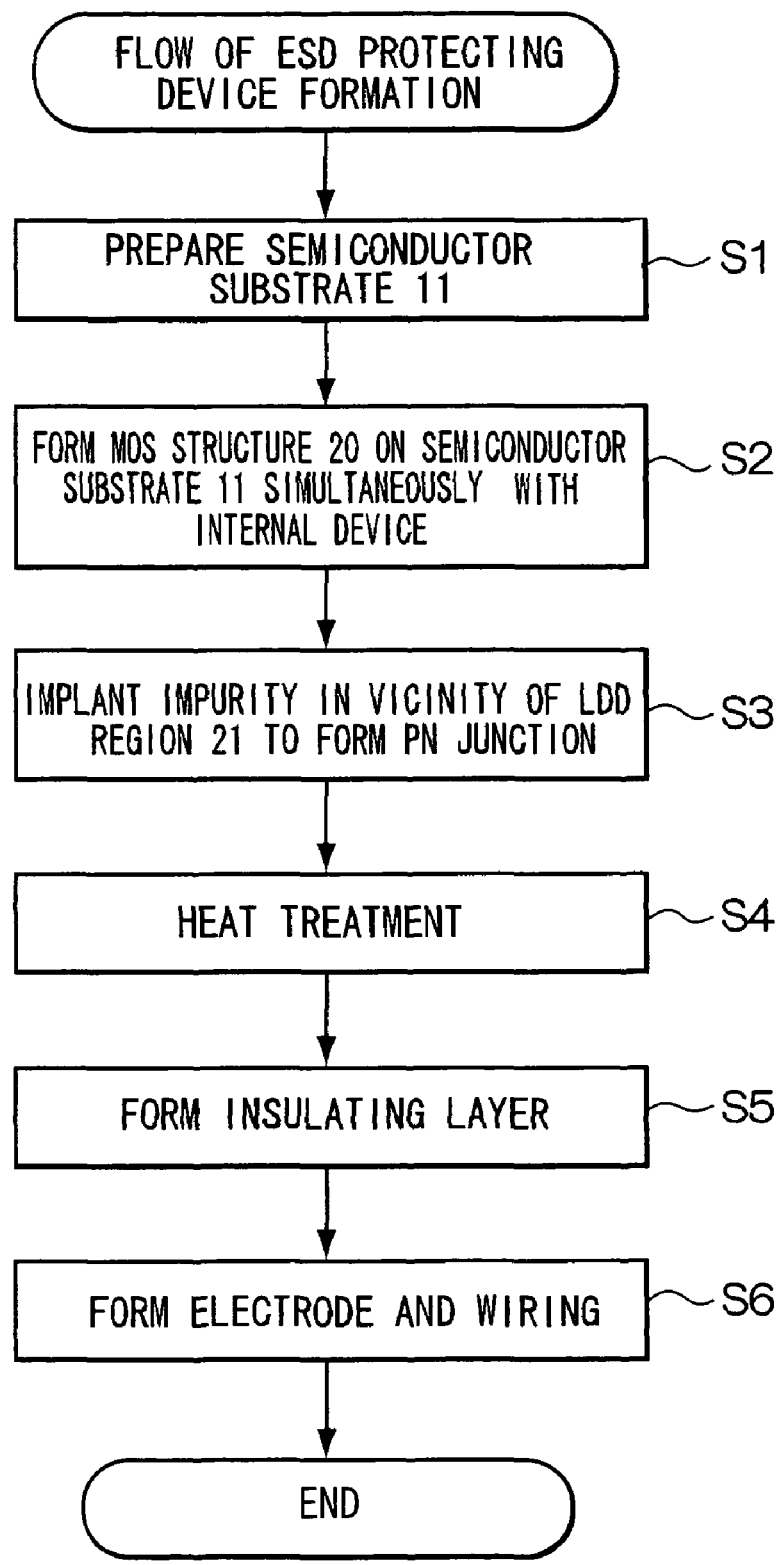
FIG. 3 is a flowchart illustrating a manufacturing flow of manufacturing method of the ESD protection device in the exemplary embodiment according to the invention.

As shown in FIG. 2, a pad 31 is connected to the drain electrode 14. The source electrode 15 and the two well electrodes 25 are connected to a ground potential. The impurity diffusion region 22 has no electrode thereon and, therefore, the impurity diffusion region 22 is connected neither to the pad 31 nor to other electrodes via electric wiring.

The pad 31 is connected also to an SCR 32. The SCR 32 has a structure in which an N well 34 serving as an N-type conductive region, an N-type impurity diffusion region 35, and a P-type impurity diffusion region 36 are formed on a P-type semiconductor substrate 33. Additionally, an N-type impurity diffusion region 37 and a P-type impurity diffusion region 38 are formed in the N well 34. On each of the impurity diffusion regions, electrodes 39a to 39d are formed, respectively. Specifically, the electrode 39a is formed on the impurity diffusion region 35; the electrode 39b is formed on the impurity diffusion region 36; the electrode 39c is formed on the impurity diffusion region 37; and the electrode 39d is formed on the impurity diffusion region 38. The electrodes 39c and 39d are connected to the pad 31 whereas the electrodes 39a and 39b are connected to a reference potential. Here, a breakdown voltage of the SCR 32 is set to be higher than that of the ESD protection device 10.

The ESD protection device 10 and the SCR 32 are connected to each other via the above-described wiring, thereby constituting an ESD protecting circuit 30 for protecting an ESD surge generated in an internal circuit (not shown).

Next, a current flow in the case of the application of the ESD surge to the pad 31 will be explained in reference to FIG. 2.

When the ESD surge is applied to the pad 3 1, breakdown occurs at the PN junction, at which the breakdown voltage is lowest. Then, the surge current flows from the drain electrode 14 toward the P well 24 in the vicinity of the impurity diffusion region 22 or the source region 13, by passing through the drain region 12, the LDD region 21, and the impurity diffusion region 22.

Normally, since a current resistance is large when the breakdown occurs at the PN junction, a voltage is increased up to the breakdown voltage of the MOS structure 20 thereafter. The MOS structure 20 is broken down, so that the surge current flows along the channel region in the MOS structure 20.

Moreover, in the case where the increased voltage allows the large surge current to flow, the SCR 32 is broken down. Therefore, the large surge current flows in the SCR 32. The large surge current flows in the SCR 32, thus prevents any breakage of the internal circuit and the ESD protection device 10.

With the above-described structure and the occurrence of the breakdown, the breakdown voltage in the ESD protection device 10 and the ESD protecting circuit 30 can be adjusted by adjusting only the concentration of the impurity diffusion region 22. Specifically, the impurity concentration of the impurity diffusion region 22 is increased to decrease the breakdown voltage. In contrast, the impurity concentration of the impurity diffusion region 22 is decreased to increase the breakdown voltage. Thus, the above-described adjustment can be achieved.

Incidentally, in the present exemplary embodiment, the ESD protection device 10 is connected to the SCR 32, thereby allowing the surge current to flow. From the viewpoint of a cost or a design, only the ESD protection device 10 may protect the internal circuit from the ESD without any connection to the SCR 32.

In FIGS. 1A and 2, an insulating layer and a wiring pattern (neither shown) are assumed to be formed on the MOS structure 20.

Next, explanation will be made in detail on a manufacturing flow of the manufacturing method of the ESD protection device in the exemplary embodiment according to the invention in reference to FIGS. 3 and 4A to 4C.

Figure 4A:
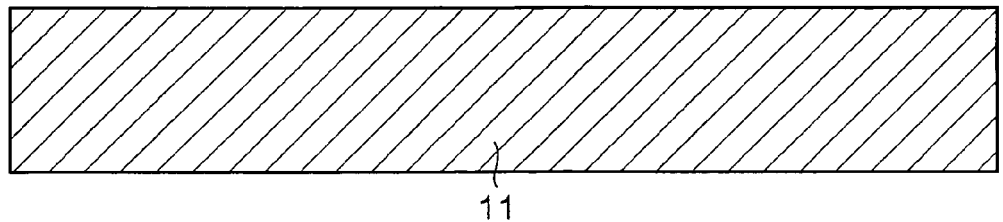
FIG. 4A is a cross-sectional view showing each of manufacturing processes of the ESD protection device in the exemplary embodiment according to the invention.
Figure 4B:
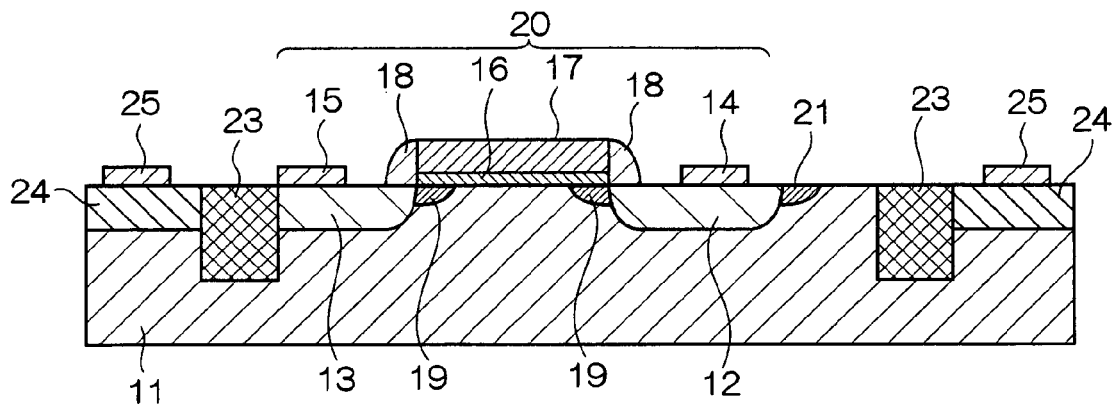
FIG. 4B is another cross-sectional view showing each of the manufacturing processes of the ESD protection device in the exemplary embodiment according to the invention.

First of all, the semiconductor substrate 11 is prepared (step S1, FIG. 4A), and then, the MOS structure 20, the device isolation region 23, the P well 24, and the well electrode 25 are formed on the semiconductor substrate 11 (step S2). At this time, in step S2, the MOS structure 20 is formed simultaneously with the internal device (that is, in the same process). The MOS structure 20 is formed in a well process, a device isolating process, a channel process, a gate forming process, an SW (side wall) forming process, and an SD (source/drain) forming process, which have been well known. At this time, a predetermined region for forming the impurity diffusion region 22 is provided between the LDD region 21 and the device isolation region 23 in the MOS structure 20. Hereinafter, step S2 is referred to as the device forming process, and the cross section of a state thereafter is shown in FIG. 4B.

Figure 4C:
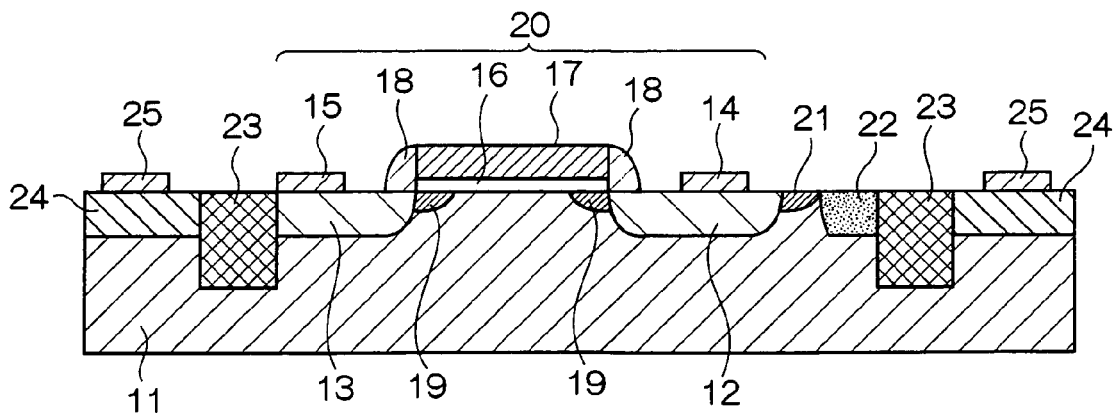
FIG. 4C is a further cross-sectional view showing each of the manufacturing processes of the ESD protection device in the exemplary embodiment according to the invention.

Next, an impurity is implanted in the vicinity of the LDD region 21 (step S3). The implantation of the impurity forms the impurity diffusion region 22 which makes the PN junction together with the LDD region 21. An implantation dose of the impurity in step S3 can adjust the breakdown voltage. In other words, the impurity diffusion region 22 fulfills the function as an adjustment layer for adjusting the breakdown voltage. Hereinafter, step S3 is referred to as an adjustment layer forming process, and the cross section of a state thereafter is shown in FIG. 4C.

And then, activation annealing, which is a heat treatment, is carried out (step S4). The activation annealing is carried out, for example, at a temperature of about 800° C. for 30 minutes. After the activation annealing, an insulating layer is formed on the semiconductor device functional layer formed on the semiconductor substrate 11 (step S5). Hereinafter, step S5 is referred to as an insulating layer forming process. After the formation of the insulating layer, electrodes and wirings are formed at predetermined positions, thereby achieving a desired wiring pattern (step S6).

When the drain region is not determined in the device forming process, impurities may be implanted at predetermined positions in such a manner as to make the PN junction together with impurity implanted regions serving as the drain region and the source region. In other words, two impurity diffusion regions may be disposed with respect to one MOS structure.

As described above, with the ESD protection device and the manufacturing method thereof in the present exemplary embodiment, the impurity diffusion region 22 for forming the PN junction together with the LDD region 21 is formed between the LDD region 21 serving as a part of the drain region 12 and the device isolation region 23 surrounding the MOS structure 20. As a consequence, the breakdown voltage of the ESD protection device 10 formed in the same process as that for the internal device can be adjusted without varying the basic performance of the internal device even at the final stage of the LSI manufacturing process.

[Second Exemplary Embodiment]

An ESD protection device in a second exemplary embodiment according to the invention is identical in structure to that in the first exemplary embodiment except the shape of the impurity diffusion region. An impurity diffusion region is formed in such a manner as to surround at least a part of a drain region. Explanation will be made on an ESD protection device 40 including such an impurity diffusion region in reference to FIG. 5. Here, the same constituent elements as those in the first exemplary embodiment are designated by the same reference numerals, and therefore, the description will be omitted below.

Figure 5:
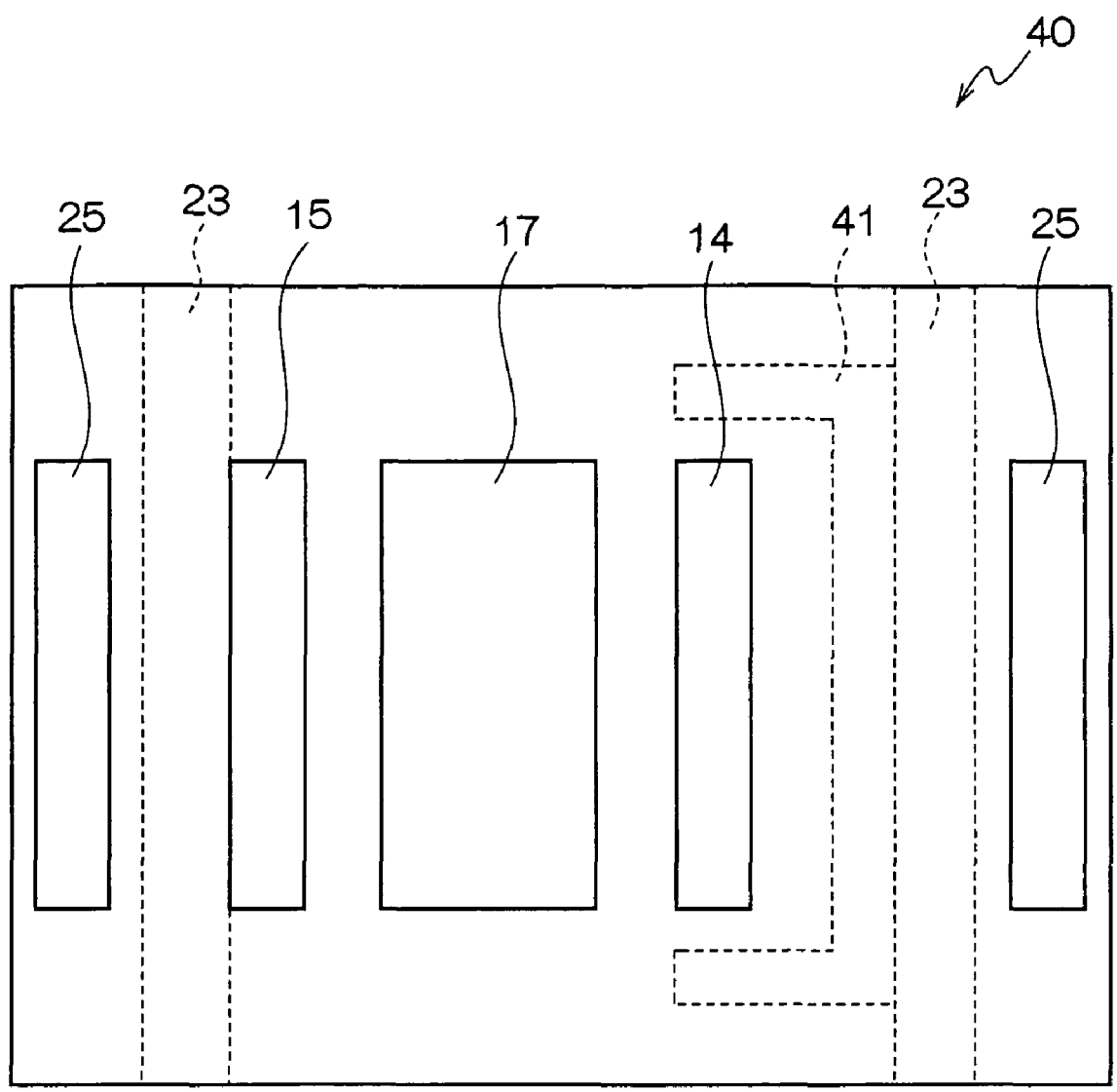
FIG. 5 a top view showing an ESD protection device in a second exemplary embodiment according to the invention.
Figure 6:
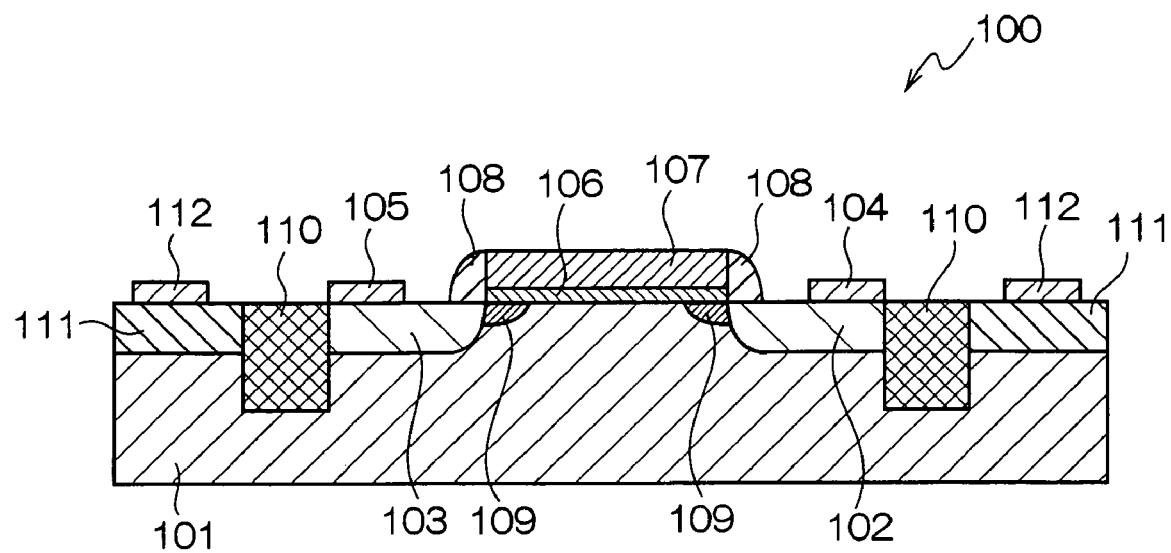
FIG. 6 is a cross-sectional view showing an ESD protection device in the prior art.

As shown in FIG. 5, an impurity diffusion region 41 extends toward a drain region 12 located under a drain electrode 14 from both ends in a long side direction thereof. In other words, the drain region 12 is surrounded in three directions by the impurity active region 41.

As shown in FIG. 5, the impurity diffusion region 41 is formed in such a manner as to surround the drain region 12, thereby decreasing a breakdown voltage at a PN junction more than in the first exemplary embodiment. Furthermore, an increase in PN junction face can readily adjust the breakdown voltage.

What is claimed is:

1. An ESD protection device including a MOS structure formed inside of a semiconductor functional device layer, the ESD protection device comprising:
    a semiconductor substrate;
    a drain region of the MOS structure being a surge absorbing end and formed in the semiconductor substrate;
    a device isolation region surrounding the MOS structure; and
    a junction forming region formed in the semiconductor substrate between the drain region of the MOS structure and the device isolation region, the junction forming region being in contact with the drain region and exposed at a surface of the semiconductor substrate to form a PN junction together with the drain region,
    the drain region including at a portion in contact with the junction forming region a lower impurity concentration drain region having an impurity concentration lower than that of another higher impurity concentration portion in the drain region, the lower impurity concentration portion being exposed at said surface,
    the higher impurity concentration portion, the lower impurity concentration portion and the junction forming region are disposed in this given order along a line that is parallel to said surface.

2. The ESD protection device according to claim 1, wherein a breakdown voltage of the junction forming region is lower than that of the MOS structure.

3. The ESD protection device according to claim 1, wherein the higher impurity concentration portion does not contact the junction forming region.

4. The ESD protection device according to claim 1, wherein the impurity concentration of the junction forming region is higher than that of a channel region in the MOS structure.

5. The ESD protection device according to claim 4, wherein a breakdown voltage of the junction forming region is lower than that of the MOS structure.

6. The ESD protection device according to claim 1, wherein the junction forming region surrounds at least a part of the drain region.

7. The ESD protection device according to claim 6, wherein a breakdown voltage of the junction forming region is lower than that of the MOS structure.

8. The ESD protection device according to claim 6, wherein the impurity concentration of the junction forming region is higher than that of a channel region in the MOS structure.

9. The ESD protection device according to claim 8, wherein a breakdown voltage of the junction forming region is lower than that of the MOS structure.

10. An ESD protection device including a MOS structure formed inside of a semiconductor functional device layer, the ESD protection device comprising:
    a semiconductor substrate;
    a drain region of the MOS structure being a surge absorbing end and formed in the semiconductor substrate;
    a device isolation region surrounding the MOS structure; and
    a junction forming region formed in the semiconductor substrate between the drain region of the MOS structure and the device isolation region, the junction forming region being in contact with the drain region and exposed at a surface of the semiconductor substrate to form a PN junction together with the drain region,
    the drain region including at a portion in contact with the junction forming region, a lower impurity concentration drain region having an impurity concentration lower than that of another higher impurity concentration portion in the drain region and being formed between the higher impurity concentration portion and the junction forming region such that the higher impurity concentration portion, the lower impurity concentration portion, and the junction forming region are disposed in this given order along a line that is parallel to said surface.

11. The ESD protection device according to claim 10, wherein the junction forming region surrounds at least a part of the drain region.

12. The ESD protection device according to claim 10, wherein the impurity concentration of the junction forming region is higher than that of a channel region in the MOS structure.

13. The ESD protection device according to claim 10, wherein a breakdown voltage of the junction forming region is lower than that of the MOS structure.

14. The ESD protection device according to claim 10, wherein the higher impurity concentration portion does not contact the junction forming region.

* * * * *